United States Patent [19]

Shimpuku et al.

[11] Patent Number: 5,355,133
[45] Date of Patent: Oct. 11, 1994

[54] DATA MODULATING METHOD AND APPARATUS AND DATA DEMODULATING METHOD AND APPARATUS

[75] Inventors: Yoshihide Shimpuku, Kanagawa; Hiroyuki Ino, Tokyo; Yasuyuki Chaki, Chiba; Toshiyuki Nakagawa, Kanagawa, all of Japan

[73] Assignee: Sony Corporation, Tokyo, Japan

[21] Appl. No.: 15,477

[22] Filed: Feb. 9, 1993

[30] Foreign Application Priority Data

Feb. 14, 1992 [JP] Japan .................................. 4-059707

[51] Int. Cl.⁵ ............................................. H03M 5/18
[52] U.S. Cl. .................................... 341/58; 341/50
[58] Field of Search ................. 341/58, 51, 67, 95, 341/102, 68, 69

[56] References Cited

U.S. PATENT DOCUMENTS 5,122,875 6/1992 Raychaudhuri .................... 351/133

Primary Examiner—Brian K. Young
Attorney, Agent, or Firm—Limbach & Limbach

[57] ABSTRACT

A modulating method and apparatus and a demodulating method and apparatus wherein high density recording can be achieved and a dc component can be controlled with a variable length channel code are disclosed. Recording data are divided into a predetermined plurality of blocks, and those of the recording data at a portion other than a boundary portion of each of the blocks are coded referring to a table of a first ROM so that data of m bits may be converted into a code of n bits. The remaining data at the boundary portion of each block are converted into a code referring to another table of second ROM so that data of m bits may be converted into a code of n bits. Further, a code of n bits for minimizing a dc component is produced referring to a third table of a further ROM and is added to the code generated by the first and second ROMs.

20 Claims, 6 Drawing Sheets

```
         1 1 /                              1 0 0 /  (0)
         1 0 /                              0 1 0 /  (0)
         0 1 /                              0 0 1 /  (0)
         0 0 /                              1 0 1 /  (0)
     0 0 0 1 /                        0 0 1 0 0 1 /  (0)
     0 0 0 0 /                        1 0 1 0 0 1 /  (0)
 0 0 0 0 0 1 /                0 0 1 0 0 1 0 0 1 /  (0)
 0 0 0 0 0 0 /                1 0 1 0 0 1 0 0 1 /  (0)
                                              ↑
                                TABLE 3 IS NOT USED
```

DATA MODULATING METHOD AND APPARATUS AND DATA DEMODULATING METHOD AND APPARATUS

BACKGROUND OF THE INVENTION

1. Field of the Invention

This invention relates to a data modulating method and apparatus and a data demodulating method and apparatus suitable for use for digitally recording data onto a record medium, and more particularly to a data modulating method and apparatus and a data demodulating method and apparatus wherein a modulated code in the form of a variable length code is used and record data in units of m bits are converted into a channel code in units of n bits.

2. Description of the Prior Art

In a magnetic recording system, generally a signal has a differentiation frequency characteristic and suffers from deterioration in a high frequency band. This arises from a loss at a head gap, a loss by a space between a head and a record medium, a loss originating in thickness of a record medium, a low frequency band loss at a rotary transformer and so forth. Further, noise such as crosstalk noise from an adjacent track, noise from a record medium and overwrite noise could cause random errors. In order to record and reproduce data accurately irrespective of such losses and noise, digital information should be recorded onto a record medium after it is modulated so that it may be compatible with a recording system, which allows a greater amount of information to be recorded stably. To this end, channel coding of data is performed in accordance with a predetermined rule.

One of such channel coding methods is block coding. The block coding involves dividing a data sequence into blocks of $m \times i$ bits and converting each data word into a channel code of $n \times i$ channel bits in accordance with a suitable coding rule. When $i=1$, the channel code is a fixed length code, but when i is greater than 1 and the binding length r is greater than 1, the channel code is a variable length code. The block code is also called (d, k;m, n;r) code. Here, d is a minimum run number of 0 while k is a maximum run number of 0.

Such block coding is disclosed in Japanese Patent Laid-Open Application No. Heisei 01-221919, laid open on Sep. 5, 1989, under the title of "Variable Length Code Converting Method". According to the prior art, the run numbers of 0 at the beginning and last ends of a code word are restricted and a decisively decodable code word is selected. Consequently, this code has a minimum magnetization reversal distance (Tmin) which is 1.33 times that of a conventional (2, 7) RLL code and is twice that of the MFM. In particular, according to the prior art, the minimum data length m is $m=2$, the minimum code word length n is $n=6$, the code word length number rmax is rmax=4, and the run number of "0" of a binary code word train of continuous code words after conversion is restricted to be inclusively between 5 and 16 (d, k). The requirements for such variable length code to be used as a code word include three requirements that the (d, k) restriction is satisfied within one code word, that the (d, k) restriction is satisfied when code words are connected to each other, and that a boundary of a code word can be discriminated correctly and can be decoded decisively, and an additional requirement that code words are allotted preferentially from that one which includes a greatest number of "1"s so that the average magnetization reversal distance may be minimized.

Similar block coding techniques are disclosed in Japanese Patent Laid-Open Applications Nos. Heisei 01-221920, Heisei 01-221921, Heisei 01-221922, Heisei 01-221923, and Heisei 01-221925, all laid open on Sep. 5, 1989.

The variable length codes disclosed in the prior art documents are disadvantageous in that, when compared with the variable length code employed in the present invention, the detecting window width Tw is narrower and the detecting efficiency upon decoding is lower.

Another block coding technique is disclosed in Japanese Patent Laid-Open Application No. Showa 59-160357, laid open on Mar. 3, 1983 under the title of "Coding and Decoding Methods for Binary Data", wherein binary data of 2 bits is converted into a conversion code of 5 bits. This technique, while making the most of a magnetization reversal distance of the HDM-3, enhances the detecting window width to 0.4 T to allow recording and reproduction of data at a high density.

More particularly, according to this block coding technique, binary data are outputted successively in synchronism with a clock signal to terminals for parallel outputs of a serial/parallel register of 10 bits. A coder receives, at input terminals thereof, the data from the output terminals of the serial/parallel register, generates a 5-bit conversion code in accordance with a coding algorithm, and outputs it to a 5-bit output terminal. The 5-bit conversion code is inputted to a 5-bit serial/parallel resistor, which outputs a conversion code train at an output terminal.

This coding method, however, does not involve a variable length code but involves a fixed length code, and employs a code resembling the variable length code employed in the present invention. However, the algorithm for generating the code is complicated, and accordingly, the hardware configuration is complicated.

A further block coding technique is disclosed in "Proposal of (3, 19;4, 9;3) Code", Collection of Theses of Spring National Conference of Electronic Information Communication Society, 1989, which describes a (3, 19;4, 9;3) code as a concrete example of a (3, k) variable length code. The code is superior in minimum magnetization reversal distance (Tmin) to the (2, 7) RLL code or the ⅔ code and is superior in Tmin×Tw (minimum magnetization reversal distance x detecting window width) to the (2, 7) RLL code.

It will also be noted that characteristic evaluation of the case wherein the code is to be used for a magneto-optic system is disclosed in Television Society Bulletin, Vol. 44, No. 10, pp. 1369-1375, 1990.

By the way, a fixed length code sometimes employs a dummy code in order to adjust the code length, and has a potential difficulty in that data cannot be recorded at a high density. In contrast, a variable length code does not use a dummy code, and accordingly, higher density recording is allowed. However, a variable length code has a potential difficulty in that a dc component cannot be controlled.

SUMMARY OF THE INVENTION

It is an object of the present invention to provide a modulating method and apparatus and a demodulating method and apparatus wherein high density recording can be achieved and a dc component can be controlled with a variable length code.

In order to attain the object described above, according to one aspect of the present invention, there is provided a data modulating method for modulating recording data into a variable length channel code, which comprises the steps of dividing the recording data into a predetermined plurality of blocks, modulating the recording data which is not at a boundary portion into a channel code.

According to a predetermined set of rules, modulating data which is at the boundary portion into a channel code according to a different set of predetermined rules, and adding a control code for minimizing the dc component to the modulated code.

According to another aspect of the present invention, there is provided a data demodulating method for demodulating a modulated code into demodulated data, which comprises the steps of dividing the modulated code into a predetermined plurality of blocks, demodulating a portion of the modulated code which is not at a boundary portion of the blocks according to a set of predetermined rules, demodulating the portion of the modulated code which is at a boundary portion according to a different set of predetermined rules, and removing from the modulated code a control code added upon modulation in order to minimize a dc component.

The control code for minimizing a dc component is added based on a digital sum variation (DSV) value till a predetermined block and another digital sum variation value of a next block.

Further, as the control code, one of a plurality of control codes prepared in advance which minimizes the digital sum variation value till the next block subsequent to the predetermined block may be added.

The above and other objects, features and advantages of the present invention will become apparent from the following description and the appended claims, taken in conjunction with the accompanying drawings in which like parts or elements are denoted by like reference characters.

BRIEF DESCRIPTION OF THE DRAWINGS

FIG. 2 is a diagrammatic view showing contents of a table stored in a ROM of the modulating apparatus shown in FIG. 1;

FIG. 3 is a diagrammatic view but showing contents of another table stored in another ROM of the modulating apparatus shown in FIG. 1;

FIG. 4 is a diagrammatic view but showing information of a further table stored in a further ROM of the modulating apparatus shown in FIG. 1;

DESCRIPTION OF THE PREFERRED EMBODIMENT

Figure 1:
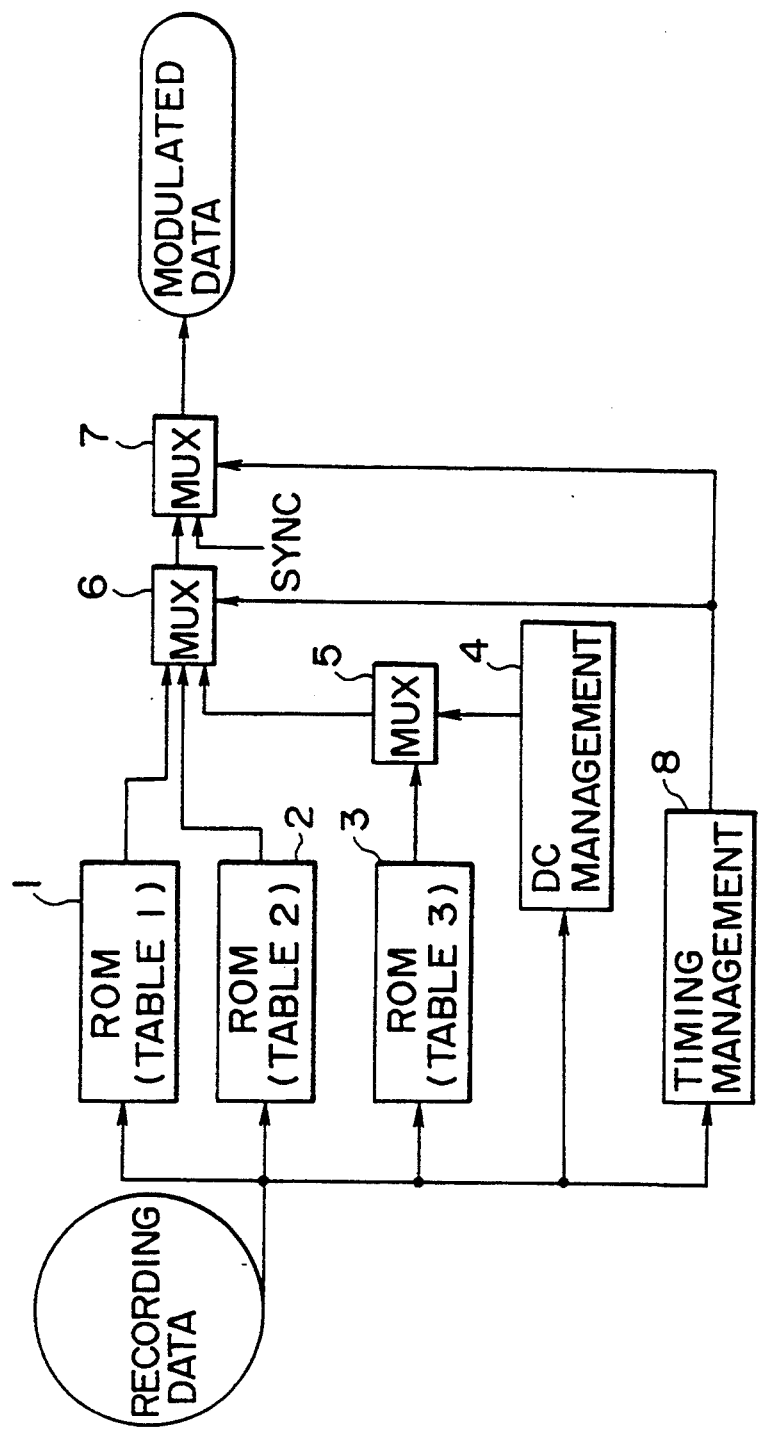
FIG. 1 is a block diagram of a modulating apparatus to which the present invention is applied.

Referring first to FIG. 1, there is shown a coding apparatus to which the present invention is applied. The coding apparatus is generally constructed such that recording data are supplied to read only memories (ROMs) 1 to 3 so that they may be coded in accordance with conversion tables 1 to 3 stored in the ROMs 1 to 3, respectively. Codes outputted from the ROMs 1 and 2 are supplied to a multiplexer (MUX) 6. Meanwhile, a further code outputted from the ROM 3 is supplied to the multiplexer 6 by way of another multiplexer (MUX) 5. A dc management circuit 4 calculates a dc component of the inputted recording data and controls the multiplexer 5 in accordance with a result of the calculation. The multiplexer 6 selects one of codes supplied thereto from the ROMS 1 and 2 and the multiplexer 5 and outputs the selected code to the multiplexer 7. Also a synchronizing signal (SYNC) is supplied from a circuit not shown to the multiplexer 7. The multiplexer 7 selects a code supplied thereto from the multiplexer 6 or the synchronizing signal and outputs it as modulated data to a circuit not shown. A timing management circuit 8 monitors inputted recording data and controls the multiplexers 6 and 7 according to a predetermined timing.

Figure 2:
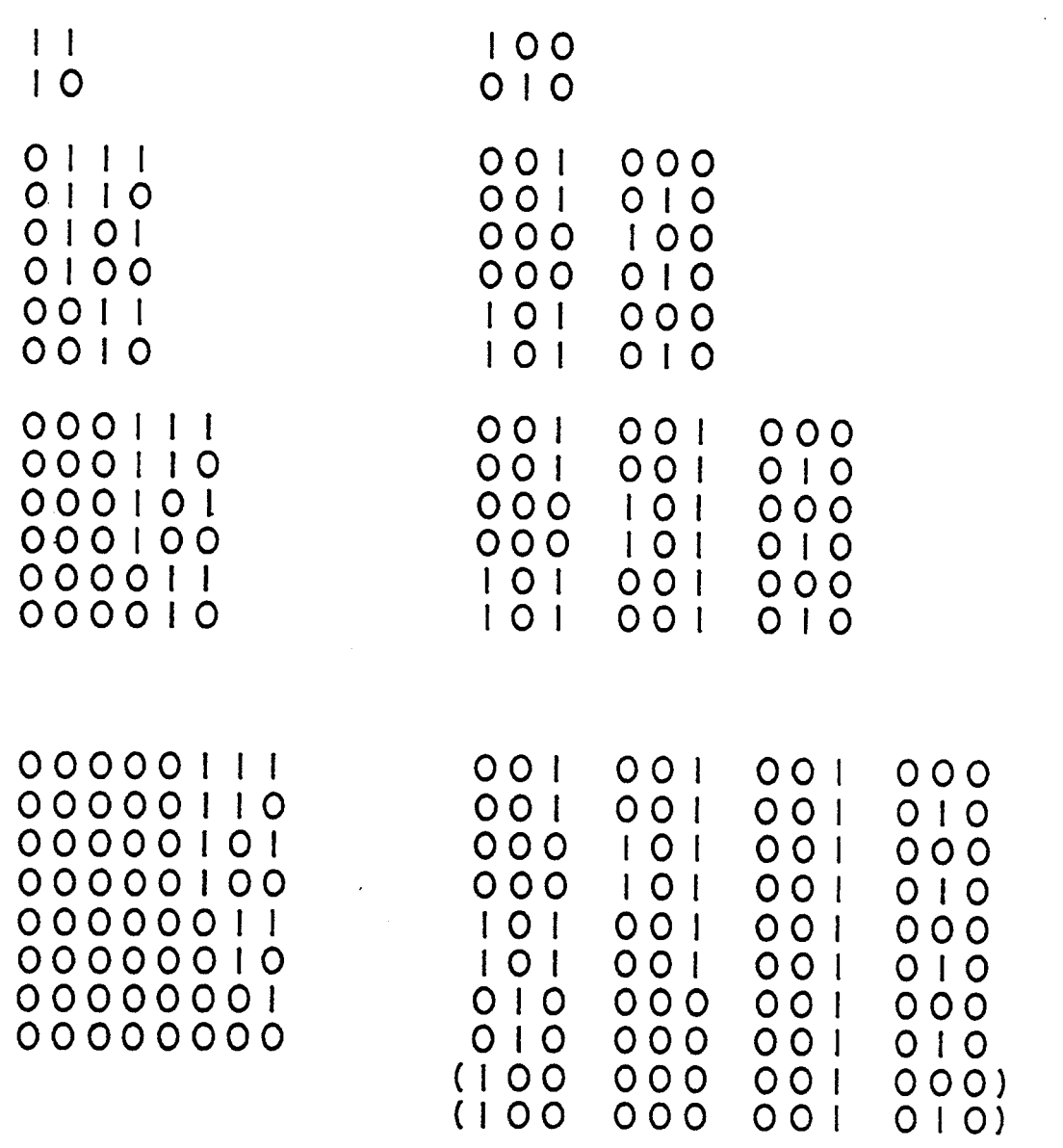

The table 1 shown in FIG. 2 is stored in the ROM 1. The table 1 serves as a conversion table for converting input recording data into a (1, 7;2, 3;4) code. In particular, each recording data of 2, 4, 6 or 8 bits shown on the left side in FIG. 2 is converted into a channel code of 3, 6, 9 or 12 bits shown on the right side in FIG. 2 in accordance with the table 1.

Figures 3, 4:
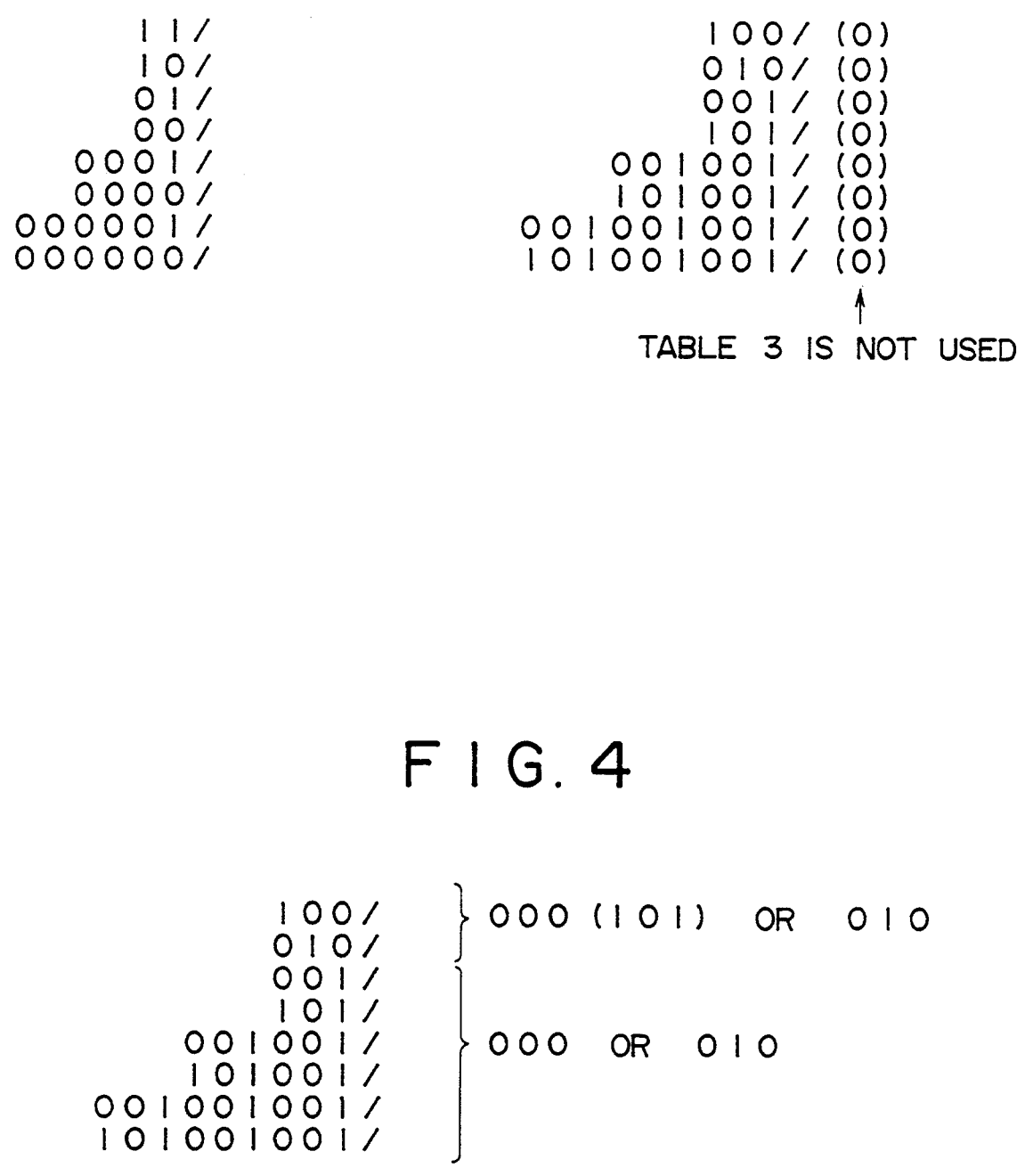

FIG. 3 shows the table 2 stored in the ROM 2. Each recording data of 2, 4 or 6 bits on the left side in FIG. 3 is converted into a channel code of 3, 6 or 9 bits shown on the right side in FIG. 3 in accordance with the table 2. It is to be noted that, when a code according to the table 3 which will be hereinafter described is not added, one "0" of one bit is added to each channel code. The table 1, shown in FIG. 2, converts recording data which is not at a boundary portion of a block as a unit of processing of recording data. The table 3, shown in FIG. 3, converts recording data at the boundary portion of the block.

In particular, if data of 4 bits shown on the left side in FIG. 2 is divided, when a boundary (last end) of the block is reached, for example, at the second bit in the former half of the data, at the boundary and the 2 bits in the former half are included into the current block while the 2 bits in the latter half are included into the next block, the 2-bit data of the former half is either 01 or 00. Similarly, when the boundary is reached at the fourth bit in the former half of recording data of 6 bits, the data at the boundary is either 0001 or 0000. Further, when the boundary is reached at the sixth bit in the former half of recording data of 8 bits, the data at the boundary is either 000001 or 000000. If the case wherein the boundary is reached with recording data of 2 bits is further taken into consideration, then recording data at the boundary presents a total of eight values shown on the left side in FIG. 3. The eight different data are converted into corresponding channel codes respectively shown on the right side of FIG. 3.

Meanwhile, the table 3 shown in FIG. 4 is stored in the ROM 3. The values indicated on the left side in FIG. 4 correspond to the values indicated on the right side in the table 2 of FIG. 3. Thus, when the channel code obtained by conversion in accordance with the table 2 is, for example, 100 or 010, the code of 000 or 010 is added. Which one of 000 or 010 is to be added is determined so that a dc component may be minimized. It is to be noted that, in this instance, the value 000 may be replaced by 101.

When the code obtained by conversion in accordance with the table 2 has any other value (001, 101, 001001, 101001, 001001001 or 101001001), either 000 or 010 is added. Also in this instance, which one of 000 and 010 is to be added is determined so that a dc component may be minimized in a similar manner as described above.

Figure 5:
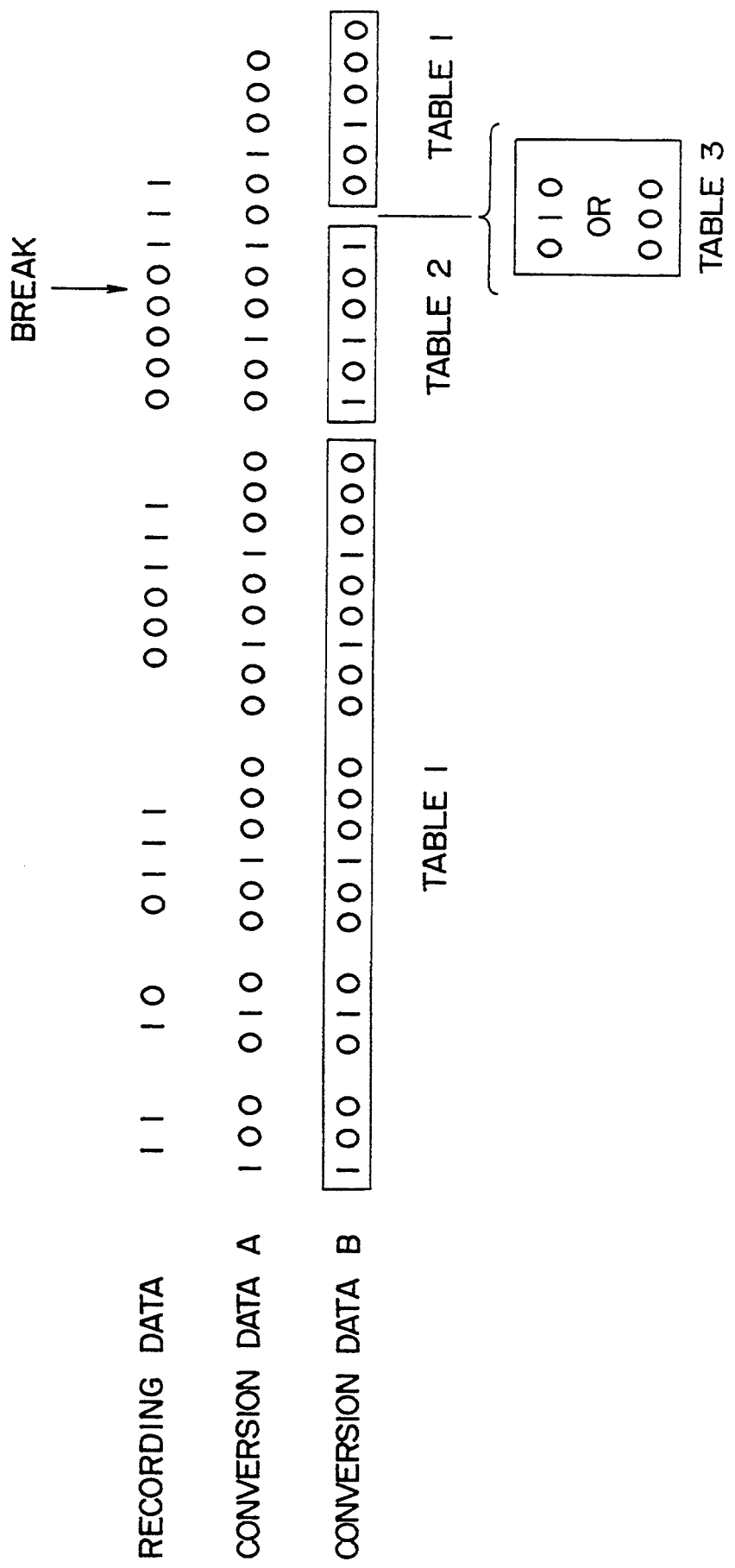
FIG. 5 is a diagrammatic view illustrating an example of modulation by the modulating apparatus shown in FIG. 1.

Operation of the coding apparatus shown in FIG. 1 will be described subsequently with reference to FIG. 5. It is assumed here that data 1110011100011100000111 are inputted as recording data as seen in FIG. 5. If the recording data are all coded in accordance with the table 1 (FIG. 2) stored in the ROM 1, then such conversion data A as seen in FIG. 5 are obtained. However, if it is assumed that a boundary of the block is positioned, for example, at a position indicated by an arrow mark in FIG. 5, then the timing management circuit 8 detects the boundary and changes over the multiplexer 6 from the ROM 1 side to the ROM 2 side. Consequently, data 100010001000001001000 indicated as conversion data B in FIG. 5 are selected by the multiplexer 6 as the conversion data obtained by conversion of the recording data of 11100111000111 in accordance with the table 1 and are outputted as modulated data by way of the multiplexer 7.

Then, the multiplexer 6 is changed over to the ROM 2 side. Consequently, data 101001 indicated as conversion data B in FIG. 5 are obtained as the conversion data obtained by conversion of the recording data 0000 in accordance with the table 2 and are outputted as modulated data by way of the multiplexers 6 and 7. Subsequently, the dc management circuit 4 calculates a digital sum variation (DSV) corresponding to the recording data until then and causes the multiplexer 5 to select either 010 or 000 from the ROM 3 in accordance with a result of the calculation so that the selected data 010 or 000 may be outputted as modulated data by way of the multiplexers 6 and 7.

After a code of one block is outputted in this manner, the remaining data 0111 of the recording data is converted as first data of the next block into the code of 001000 as the conversion code A in accordance with the rule of the table 1 of the ROM 1. Succeeding recording data are thereafter coded in a similar manner.

Figure 6:
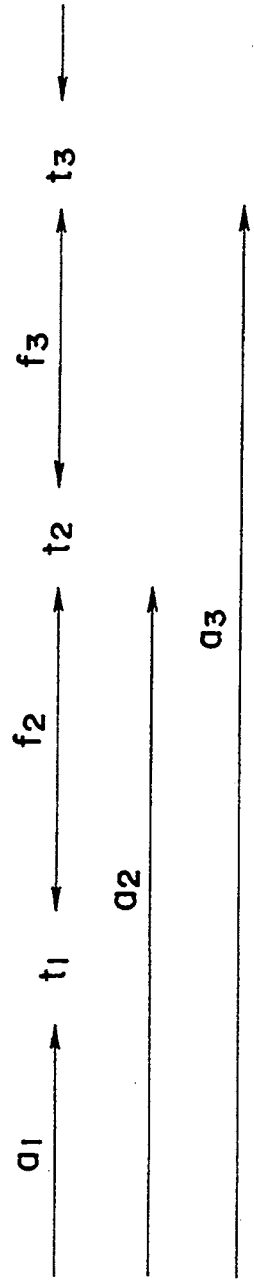
FIG. 6 is a diagrammatic view illustrating operation of a dc management circuit of the modulating apparatus shown in FIG. 1.

Subsequently, a calculating method which is performed by the dc management circuit 4 so as to minimize a dc component will be described with reference to FIG. 6. It is assumed now that, as shown in FIG. 6, data $A_1$, $A_2$ and $A_3$ are added in accordance with the rule of the table 3 subsequently to channel codes $C_1$, $C_2$ and $C_3$, respectively, obtained by conversion in accordance with the tables 1 and 2. In this instance, the digital sum variation until the data $A_1$ is represented by $a_1$, the digital sum variation until $A_2$ by $a_2$, the digital sum variation until $A_3$ by $a_3$, and the digital sum variations at the codes $C_2$ and $C_3$ are represented by $f_2$ and $f_3$, respectively.

Under the conditions described above, the values of the data $A_1$ to $A_3$ are determined in the following manner.

First, the value (000 (non-reverse) or 010 (reverse)) is determined taking the value $a_1$ of the digital sum variation until $A_1$ and the value $f_2$ of the digital sum variation of the code $C_2$ into consideration. In particular, if the values $a_1$ and $f_2$ have a same sign (both are positive or both are negative), the reverse value (010) is selected, but if they have different signs (one of them is positive and the other is negative), the non-reverse value (000 or 101) is selected. Similarly, if the values $a_2$ and $f_3$ have a same sign, the value $A_2$ is set to 010, but if they have different signs, the value $A_2$ is set to 000 or 101.

Such calculation can be realized with a simple hardware configuration.

When the non-reverse value is determined and one of the values 000 are 101 is used, but when either one of the values 000 and 101 is to be selected, this selection can be made in the following manner. In this instance, values of the digital sum variation of the value $a_2$ are calculated applying all of the values stored as the value $A_1$ in the table 3 (the digital sum variation of the value $A_1$ is represented by $t_1$), and one of the thus calculated values which exhibits the smallest value among them is adopted as the value $A_1$. In particular, the value $a_2$ is calculated applying 000 as the value $A_1$, and then the value $a_2$ is calculated applying 010. Further, these two alternative, calculated values for $a_2$ are compared with each other, and one of them which presents a smaller $a_2$ value is selected as the value $A_1$.

Also in selection of a value for the value $A_2$, the value $a_3$ is calculated applying 000 as the value $A_2$, and then the value $a_3$ is calculated applying 010. Then, these two alternative calculated values for $a_2$ are compared with each other, and one of them which presents a smaller $a_3$ value is selected as the value $A_2$.

Where selection of one of the non-reverse conditions is adopted, the hardware configuration is complicated compared with another configuration in which a fixed non-reverse condition is adopted, but the value of the digital sum variation can be minimized.

Figure 7:
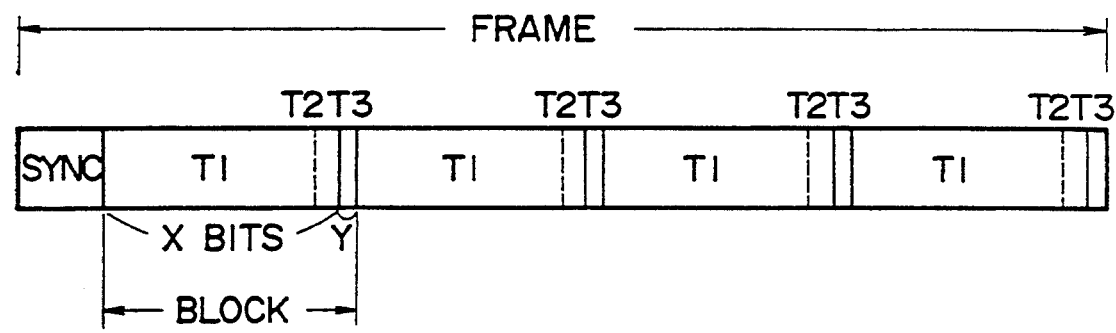
FIG. 7 is a diagrammatic view but showing a signal format of modulated data obtained by the modulating apparatus shown in FIG. 1.

FIG. 7 illustrates a signal format of a code obtained in this manner. In the signal format shown, one frame is constituted from four blocks, and a synchronizing signal is added to the top of the frame. Each of the blocks is constituted from a code $T_1$ obtained by conversion in accordance with the table 1, another code $T_2$ obtained by conversion in accordance with the table 2, and a further code $T_3$ obtained by conversion in accordance with the table 3. The codes $T_1$ and $T_2$ are codes of original data and the code $T_3$ is a code of control bits. Accordingly, if the codes $T_1$ and $T_2$ have a total of X bits and the code $T_3$ has Y bits, then the redundancy in the present format is given by $Y/(X+Y)$.

In the present embodiment, when data are to be recorded digitally onto a magnetic tape, high density channel codes having the minimum reversal distance Tmin=1.28, the detecting window width Tw=0.64 and the maximum reversal distance Tmax=5.12 can be obtained.

Figure 8:
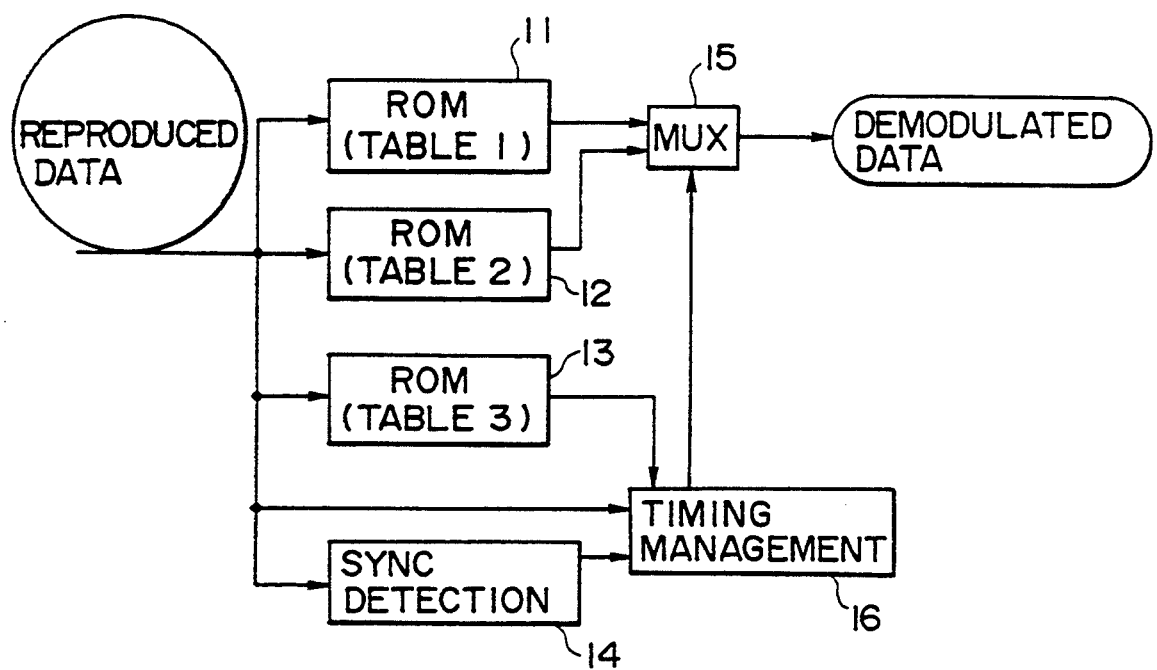
FIG. 8 is a block diagram of an apparatus for demodulating data obtained by the modulating apparatus shown in FIG. 1.

FIG. 8 shows an example of configuration of a decoding apparatus which demodulates data obtained by modulation by the apparatus shown in FIG. 1. Referring to FIG. 8, the decoding apparatus shown is generally constructed utilizing a reverse converting circuit for tables 1 and 2 (a circuit for converting codes on the right side into code on the left side of FIGS. 2 and 3) from ROMs 11, 12 and 13, contain tables corresponding respectively to the tables 1, 2 and 3 in the ROMs 1, 2 and 3 of the modulating apparatus of FIG. 1. A synchronizing signal detecting circuit 14 detects a synchronizing signal from reproduced data and supplies such detection signal to a timing management circuit 16. The timing management circuit 16 monitors the input reproduced data and an output of the synchronizing signal detecting circuit 14 and controls a multiplexer circuit 15 according to a predetermined timing.

In particular, when data originating in conversion in accordance with the table 1 are received as the input reproduced data, the timing management circuit 16 controls the multiplexer 15 so that the output of the ROM 11 may be selected. On the other hand, when data originating in conversion in accordance with the table 2 are received as the input reproduced data, the timing management circuit 16 controls the multiplexer 15 so that the output of the ROM 12 may be selected. Further, at a timing when a code originating in conversion in accordance with the table 3 is received as the input reproduced data, the timing management circuit 16 controls the multiplexer 15 so that the reproduced data may not be outputted. Demodulated data are obtained from the multiplexer 15 in this manner.

While the tables 1 to 3 are used in combination in the coding and decoding apparatus described above, alternatively the tables 1 and 2 or the tables 1 and 3 may be used in combination.

It is to be understood that the above described embodiment of the invention is illustrative only, and that modifications thereof may occur to those skilled in the art. Accordingly, the present invention is not to be regarded as limited to the embodiment disclosed herein, but is to be limited only as defined by the appended claims.

What is claimed is:

1. A data modulating method for modulating recording data into a variable length channel code, comprising the steps of:
   dividing the recording data into a predetermined plurality of blocks;
   modulating data which is not at a boundary portion of each of the blocks into a channel code according to a first set of rules;
   modulating data which is at a boundary portion of each of the blocks into a channel code according to a second set of rules; and
   wherein the first set of rules will produce a different channel code than the second set of rules for some sequences of recording data.

2. A data modulating method for modulating recording data into a variable length channel code, comprising the steps of:
   dividing the recording data into a predetermined plurality of blocks;
   modulating the recording data at a portion other than a boundary portion of each block in accordance with a first rule in which data in units of m bits is modulated into a code in units of n bits, n being greater than m;
   modulating the recording data at the boundary portion of each block in accordance with a second rule different from the first rule in which data in units of m bits is modulated into a code in units of n bits, and
   adding a control code for minimizing a dc component in accordance with a third rule to the code obtained by modulation in accordance with the second rule.

3. A data modulating method according to claim 2, wherein the third rule defines addition of the control code based on a digital sum variation value until a predetermined block and another digital sum variation value of a next block.

4. A data modulating method according to claim 3, wherein the third rule defines addition of that one of a plurality of control codes prepared in advance which minimizes the digital sum variation value until the next block subsequent to the predetermined block.

5. A data modulating method according to any one of claims 2 to 4, wherein the control code is constituted from n bits.

6. A data demodulating method for demodulating a modulated code into demodulated data, comprising the steps of:
   dividing the modulated code into a predetermined plurality of blocks;
   demodulating data which is not at a boundary portion of each of the blocks into demodulated data according to a first set of rules;
   demodulating data which is at a boundary portion of each of the blocks into demodulated data according to a second set of rules; and
   wherein the first set of rules will produce a different demodulated data than the second set of rules for some sequences of modulated code.

7. A data demodulating method for demodulating a modulated code into demodulated data, comprising the steps of:
   dividing the modulated code into a predetermined plurality of blocks;
   demodulating a portion of the modulated code at a portion other than a boundary portion of each block in accordance with a first rule in which a code in units of n bits is demodulated into data in units of m bits, m being smaller than n;
   demodulating a portion of the modulated code at the boundary portion of the block in accordance with a second rule different from the first rule in which a code in units of n bits is demodulated into data in units of m bits; and
   removing a control code added upon modulation in order to minimize a dc component from the modulated code.

8. A data demodulating method according to claim 7, wherein the control code is a code added based on a digital sum variation value until a predetermined block and another digital sum variation value of a next block.

9. A data modulating method according to claim 7 or 8, wherein the control code is constituted from n bits.

10. A data modulating apparatus for modulating recording data into a variable length channel code, comprising:
    first modulating means for dividing the recording data into a predetermined plurality of blocks and modulating those of the recording data at a portion other than a boundary portion of each of the blocks into a channel code in accordance with a first rule;
    second modulating means for modulating the remaining data at the boundary portion of each block into a channel code in accordance with a second rule; and
    multiplexing means for multiplexing outputs of said first and second modulating means.

11. A data modulating apparatus according to claim 10, wherein said first modulating means operates in accordance with the first rule in which those of the recording data in units of m bits at the portion other than the boundary portion of each block are modulated into a channel code in units of n bits, n being greater than m, whereas said second modulating means operates in accordance with the second rule different from the first rule in which those of the recording data in units of m bits at the boundary portion of the block are modulated into a channel code in units of n bits, and further comprising dc controlling means for adding a control code for minimizing a dc component in accordance with a third rule to a channel code obtained by modulation in accordance with the second rule.

12. A data modulating apparatus according to claim 11, wherein the third rule defines addition of the control code based on a digital sum variation value until a predetermined block and another digital sum variation value of a next block.

13. A data modulating apparatus according to claim 12, wherein said dc controlling means adds that one of a plurality of control codes prepared in advance which minimizes the digital sum variation value until the next block subsequent to the predetermined block.

14. A data modulating apparatus according to claim 12 or 13, wherein the control code is constituted from n bits.

15. A data demodulating apparatus for demodulating a modulated code into demodulated data, comprising:

first demodulating means for dividing the modulated code into a predetermined plurality of blocks and demodulating a portion of the modulated code at a portion other than a boundary portion of each of the blocks in accordance with a first rule;

second demodulating means for demodulating the remaining portion of the modulated code at the boundary portion of each block in accordance with a second rule; and multiplexing means for multiplexing outputs of said first and second demodulating means.

16. A data demodulating apparatus according to claim 15, wherein said first demodulating means operates in accordance with the first rule in which a code in units of n bits is demodulated into data in units of m bits, m being smaller than n, whereas said second demodulating means operates in accordance with the second rule different from the first rule in which a code in units of n bits is demodulated into data in units of m bits, m being smaller than n, and further comprising management means for removing from the modulated code a control code added upon modulation in order to minimize a dc component.

17. A data demodulating apparatus according to claim 16, wherein the control code is a code added based on a digital sum variation value until a predetermined block and another digital sum variation value of a next block.

18. A data modulating apparatus according to claim 16 or 17, wherein the control code is constituted from n bits.

19. A data modulating apparatus for modulating recording data into a variable length channel code, comprising:

first modulating means for dividing the recording data into a predetermined plurality of blocks and modulating those of the recording data in units of m bits at a portion other than a boundary portion of each of the blocks into a channel code in units of n bits in accordance with a first rule, n being greater than m;

second modulating means for modulating the remaining data in unit of m bits at the boundary portion of each block into a channel code in units of n bits in accordance with a second rule; and dc controlling means for adding a control code of n bits for minimizing a dc component to a channel code obtained by modulation in accordance with the second rule based on a digital sum variation value until a predetermined block and another digital sum variation value of a next block; and multiplexing means for multiplexing outputs of said first and second modulating means and said dc controlling means.

20. A data demodulating apparatus for demodulating a modulated code into demodulated data, comprising:

first demodulating means for dividing the modulated code into a predetermined plurality of blocks and demodulating a portion of the modulated code in units of n bits at a portion other than a boundary portion of each of the blocks into demodulated data in units of m bits in accordance with a first rule, m being smaller than n;

second demodulating means for demodulating the remaining portion of the modulated code in units of n bits at the boundary portion of each block into demodulated data in units of m bits in accordance with a second rule;

management means for removing from the modulated code a control code of n bits added upon modulation based on a digital sum variation value until a predetermined block and another digital sum variation value of a next block in order to minimize a dc component and;

multiplexing means for multiplexing outputs of said first and second demodulating means.

* * * * *